United States Patent [19]
Dobuzinsky et al.

[11] Patent Number: 5,455,204
[45] Date of Patent: Oct. 3, 1995

[54] THIN CAPACITOR DIELECTRIC BY RAPID THERMAL PROCESSING

[75] Inventors: David M. Dobuzinsky; Son V. Nguyen, both of Hopewell Junction, N.Y.; Tue Nguyen, Camas, Wash.

[73] Assignee: International Business Machines Corporation, Armonk, N.Y.

[21] Appl. No.: 353,760

[22] Filed: Dec. 12, 1994

[51] Int. Cl.$^6$ .................................................. H01L 21/02
[52] U.S. Cl. .................. 437/238; 437/241; 437/242; 437/243; 437/235; 437/919
[58] Field of Search ........................ 437/238, 241, 437/242, 243, 235, 919

[56] References Cited

U.S. PATENT DOCUMENTS

| | | | |
|---|---|---|---|
| 3,962,713 | 6/1976 | Kendall et al. | 257/599 |
| 4,113,515 | 9/1978 | Kooi et al. | 148/1.5 |
| 4,980,307 | 12/1990 | Ito et al. | 437/40 |
| 4,990,463 | 2/1991 | Mori | 437/52 |
| 4,996,081 | 2/1991 | Ellul et al. | 437/241 |
| 5,028,560 | 7/1991 | Tsukamoto et al. | 437/81 |
| 5,032,545 | 7/1991 | Doan et al. | 437/242 |
| 5,091,761 | 2/1992 | Hiraiwa et al. | 257/306 |
| 5,160,987 | 11/1992 | Pricer et al. | 257/307 |
| 5,198,392 | 3/1993 | Fukuda et al. | 437/241 |
| 5,219,783 | 6/1993 | Moslehi et al. | 437/57 |
| 5,254,506 | 10/1993 | Hori | 437/242 |
| 5,256,563 | 10/1993 | Moslehi et al. | 437/152 |

OTHER PUBLICATIONS

Miyatake et al., "High Reliability of Ultrathin Improved SIN on Poly–Si," Japanese Journ. of Applied Physics, vol. 28, No. 12, pp. L2301–L2304, Dec. 1989.

Ting et al., "Thin Stacked Oxide/Nitride/Oxide Dielectrics Formation by in Situ Multiple Reactive Rapid Thermal Processing," Appl, Phys. Lett., vol. 55, No. 22, pp. 2313–2315, Nov. 1989.

Moslehi et al., "Compositional Studies of Thermally Nitrided Silicon Dioxide (Nitroxide)," Journal of the Electochemical Society, vol. 132, No. 9, pp. 2189–2197, Sep. 1985.

Moslehi et al., "Thermal Nitridation of Si and $Sio_2$ for VLSI," IEEE Trans. Elec. Devices, vol. ED–32, No. 2, pp. 106–123, Feb. 1985.

Primary Examiner—Brian E. Hearn
Assistant Examiner—Trung Dang
Attorney, Agent, or Firm—Heslin & Rothenberg

[57] ABSTRACT

The invention provides a continuous rapid thermal process for forming a substantially uniform oxynitride film on fingered three-dimensional silicon structures comprising cleaning of the silicon substrate and growth of silicon oxide in the presence of ozone, nitridation of the silicon oxide layer in the presence of $NH_3$ and reoxidation of the oxynitride layer in the presence of oxygen.

19 Claims, 3 Drawing Sheets

THIN CAPACITOR DIELECTRIC BY RAPID THERMAL PROCESSING

TECHNICAL FIELD

The present invention relates to formation of an oxynitride layer on a semiconductor device, and more particularly to formation of a thin capacitor dielectric on three-dimensional silicon structures by rapid thermal processing.

BACKGROUND

In order to remain cost competitive, VLSI and ULSI technologies have been incorporating ever-increasing device densities within their structures. Accordingly, the technology of producing such semiconductor devices has been continually pressured to decrease the surface area required by individual devices in order to increase the corresponding device densities. However, due to the fact that existing device densities are already extremely high, the absolute physical limits will soon be reached in the conventional two-dimensional approach to semiconductor device design. This is particularly true with storage capacitors since the amount of charge necessary to send signals is limited by the presence of environmental particulate radiation inherent within the fabrication materials. Thus, the ability to reduce the surface area utilized by a storage capacitor has been severely restricted. However, the size of the storage capacitors has been decreased due to two significant advances, namely 1) decreases in the thickness of capacitor materials and 2) utilization of three-dimensional designs in which the capacitor memory cell has been altered to provide the capacitor in a vertical dimension. Thus, improved semiconductor technology requires design and process techniques capable of forming three-dimensional structural features which are measured in tens of Angstroms (Å) and in which multiple circuit features are provided in the vertical dimensions.

There are a variety of three-dimensional semiconductor designs known in the art today, for example, Kendall et al. U.S. Pat. No. 3,962,713, describes a three-dimensional capacitor structure formed by a series of vertical fins in the surface of a semiconductor substrate. The fins are oxided and coated with a conductor to form the capacitor. In addition, U.S. Pat. No. 5,160,987 issued to Pricer et al. discloses a method of making three-dimensional semiconductor structures, which in one embodiment as shown in FIG. 1, consists of depositing a series of doped layers 10 and undoped layers 12 of polysilicon upon a semiconductor substrate to form a multiplane laminate. A hexagonal pattern of small vertical trenches extending through the laminate are formed and then an isotropic etch, which preferentially reacts with the lightly doped silicon, is applied to etch the lightly doped silicon thereby exposing the highly doped polysilicon and forming a plurality of trenches 14 in the laminate. Next, by utilizing a blocking mask one or more capacitor islands are formed on the substrate. A thin capacitor dielectric layer is formed by chemically depositing a thin oxynitride dielectric layer 16 of about 150Å upon the exposed surfaces of the highly doped polysilicon. Next, boron doped polysilicon 18 is conformally deposited within the trenches in the laminate, thereby forming a storage capacitor extending in the vertical direction which covers a minimal surface area of the semiconductor substrate.

Accordingly, there exists a need for an exacting method of forming a thin capacitor dielectric evenly over intricate surfaces of three-dimensional shaped silicon structures. However, formation of such capacitor dielectrics poses various problems. In this regard much of the dielectric material must enter through very narrow orifices and yet must still be uniformly distributed over a large cavernous surface. In addition, due to the intricate nature of the three-dimensional structures, the silicon structures are often fragile and as such susceptible to damage from many common processing techniques, in particular from cleaning processes. Furthermore, due to the ever decreasing thickness of the dielectric materials and demand for increased device densities the resulting orifices and cavernous surfaces of the three-dimensional structures are likewise decreasing. Therefore, many techniques for forming oxynitride layers may be inappropriate because the resulting film's thickness may so fill the cavern that a uniform etch back does not occur. In particular, chemical vapor deposition of such materials is often inappropriate for this very reason. In addition, many methods of forming oxynitride films result in a film having nitrogen pile up at the silicon/silicon oxide interface and/or the silicon oxide surface. This nitrogen pile up tends to generate trapped charges in the insulator, thus, making it undesirable for application within a storage capacitor.

It is therefore an object of the present invention to provide a method for forming a thin capacitor dielectric in the form of a uniform oxynitride layer which utilizes only rapid thermal processing techniques. It is a further object of the present invention to provide such a method which is more efficient, having fewer processing steps and a shorter cycle time. It is a further object to produce a capacitor dielectric which is capable of being formed evenly over three-dimensional silicon structures and which may be utilized with such structures without causing damage thereto. It is a further object of the present invention to employ a process which allows exacting control over film thickness. It is a further object of the present invention to create a uniform oxynitride film which provides superior capacitance characteristics. It is a further object of the present invention to create a uniform oxynitride film less susceptible to formation of trapped charges or current leakage.

DESCRIPTION OF THE INVENTION

Figure 1:
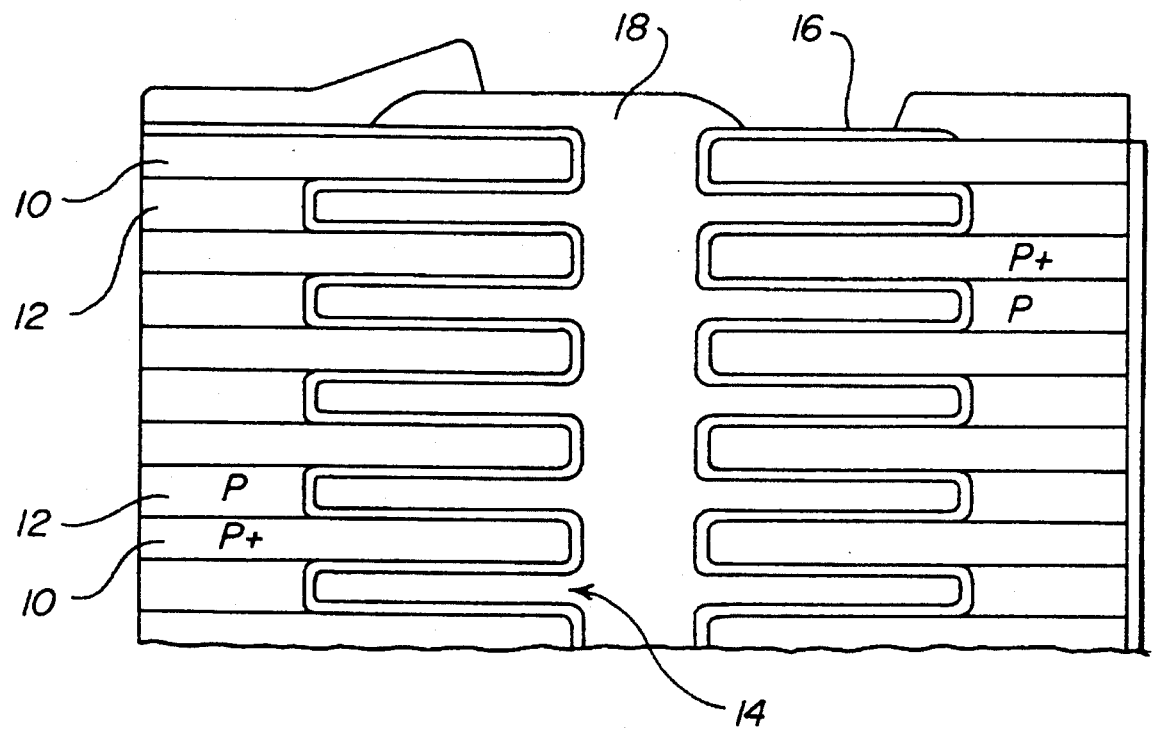
FIG. 1 is a side cross-sectional view of a portion of a capacitor having three-dimensional silicon structures.

The present invention encompasses a method of making a thin silicon oxynitride film in a semiconductor device, comprising: cleaning the surface of the device in the presence of $O_3$; heating said device to about 1050° C. for 5 to 70 seconds in the presence of $O_3$; heating the device to a temperature of about 1100° C. in the presence of $NH_3$ for 30 to 60 seconds; and then heating the device to a temperature of about 1050° C. in the presence of $O_2$ or $O_3$ for 60 to 120 seconds.

In one embodiment, the present method is utilized upon three-dimensional silicon structures in order to create a dielectric layer. The three-dimensional silicon structure may be fabricated by means well known in the art, an example being the three-dimensional semiconductor structure of alternating doped and undoped polysilicon layers formed in accordance with U.S. Pat. No. 5,160,987 issued to Price et al., the contents of which are incorporated herein by reference. Silicon, as used in this application, includes polysilicon (polycrystalline silicon), amorphous silicon (noncrystalline silicon), monocrystalline silicon and silicon germanium materials. Such silicon may be N or P doped or undoped.

After the three-dimensional or fingered silicon structures have been created, the silicon substrate may be placed in a reactor vessel or reaction chamber. Ozone ($O_3$) is flowed into the chamber and then the temperature of the reaction chamber may be rapidly increased to a temperature of 300°–400° C. Preferably the silicon substrate is subjected to these conditions for approximately 5 to 60 seconds during which time the surfaces of the silicon substrate are cleaned, with organic contaminants on the substrate surface being removed.

The temperature within the reaction chamber may then be rapidly elevated to 800° C. to 1100° C., preferably approximately 1050° C., for 5 to 70 seconds in order to form an initial silicon oxide layer on the exposed surfaces of the silicon structure. Preferably the silicon substrate is subjected to the thermal oxidation conditions for a period of 5 to 48 seconds and more preferably for a period of 5 to 15 seconds. As can be seen from a review of the chart hereinbelow, the length of time that the silicon structure is exposed to the $O_3$ at this elevated temperature is directly related to the resulting thickness of the oxynitride film. Thus, the resulting oxynitride thickness may be varied with the time allowed for growth of the initial oxide layer. Therefore, it is preferred that elevation of the temperature within the vessel be increased rapidly, preferably increased at a rate above 200° C./second, since shortening the time necessary to elevate the temperature provides greater control over the extent of oxidation and the thickness of the ultimate oxynitride film.

| SAMPLE | RTP PROCESSING TIME (sec.) | | | OXYNITRIDE THICKNESS (Å) |
|---|---|---|---|---|
| | $O_3$, 1050 C | $NH_3$, 1100 C | $O_2$, 1050 C | |
| 1 | 5 | 60 | 60–120 | 59–62 |
| 2 | 15 | 60 | 60 | 71 |
| 4 | 38 | 60 | 60 | 95 |
| 5 | 50 | 60 | 60 | 102 |
| 6 | 70 | 60 | 60 | 120 |

The film's uniformity are less than +/- 1Å on each wafer and from wafer-to-wafer.

Ammonia ($NH_3$) may then be flowed into the reaction chamber and the temperature within the reaction chamber may then be increased to 950° C. to 1150° C., preferably approximately 1100° C., for 30 to 60 seconds. It is believed that the surface of the silicon oxide films are nitrided and incorporate silicon nitride bonds at the top 50–90Å surface, thereby forming a silicon oxynitride ($SiO_xN_y$). However, it is not believed that this initial oxynitride film has a nitrogen concentration which is evenly distributed with depth.

Figure 2:
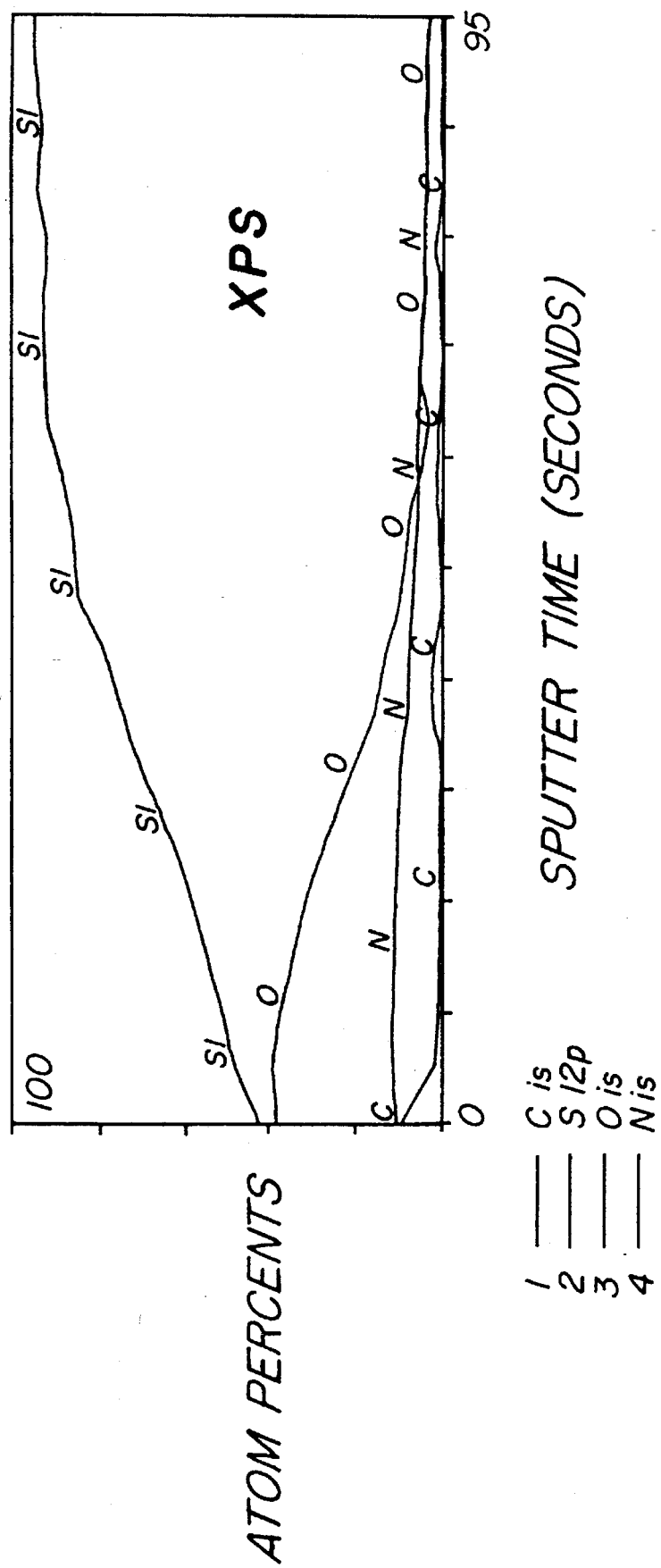
FIG. 2 is a compositional analysis by XPS of a silicon oxynitride layer formed by the process of the present invention.
Figure 3:
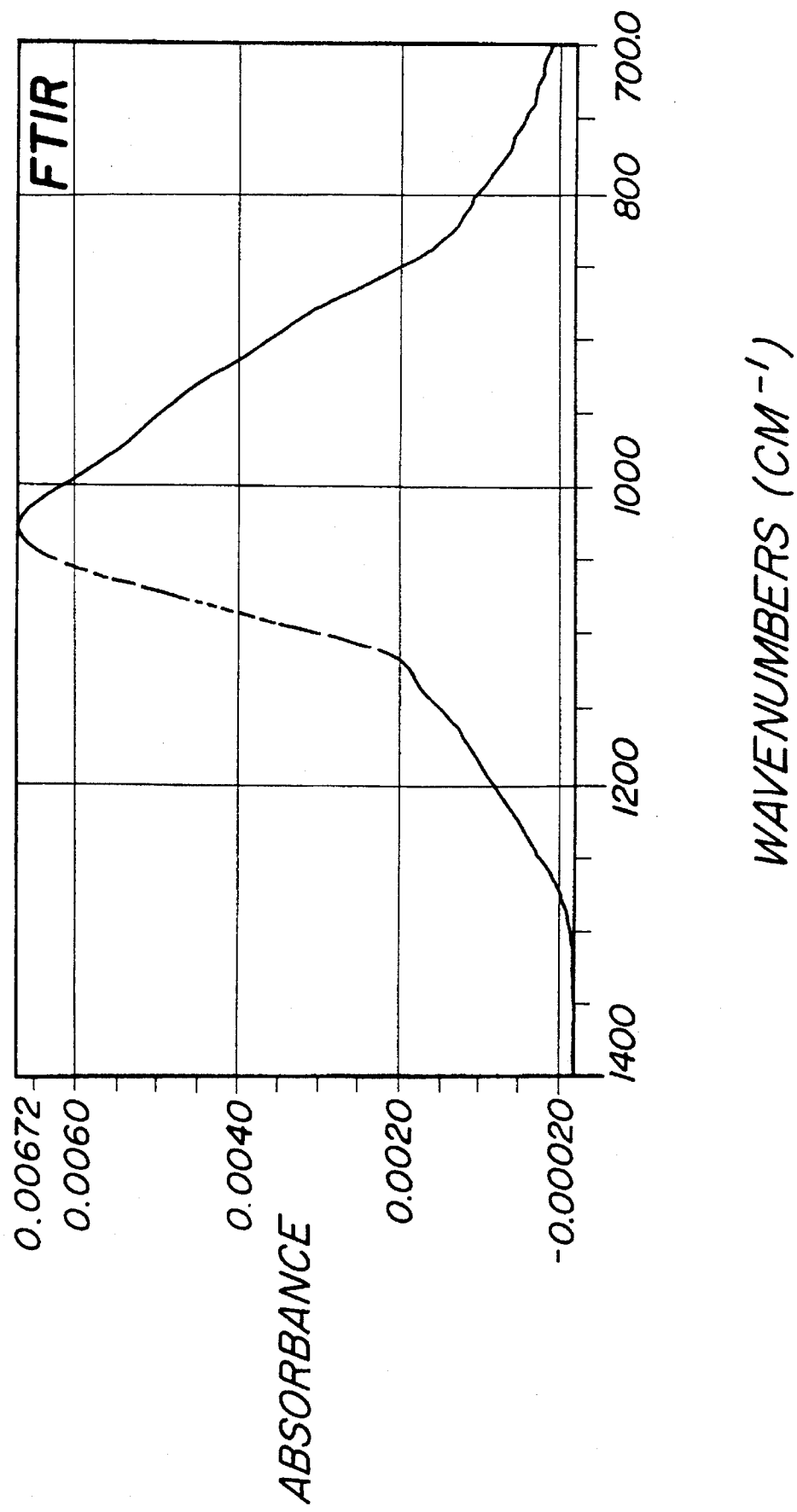
FIG. 3 is a graph of compositional analysis by FTIR analyzing a silicon oxynitride film formed by the present process.

The temperature within the reaction chamber may then be decreased to 800° C. to 1100° C., preferably approximately 1050° C., and oxygen ($O_2$) or ozone ($O_3$) is then flowed into the reaction chamber for 60 to 120 seconds, thereby forming the final uniform thin 5–12 nm silicon oxynitride layer. As can be seen in reference to FIG. 2, XPS analysis of the film formed by the present method indicates that the nitride composition is substantially uniform throughout the depth of the film. Furthermore, FTIR analysis as shown in FIG. 3, establishes that the ratio of silicon oxide bonds to silicon nitride bonds is approximately 2.2.

Formation of the thin silicon oxynitride film grown by this continuous process forms a substantially uniform oxynitride film over three-dimensional storage capacitor structures having cavernous configurations with very narrow orifices. The present rapid thermal processing method requires little process time and also incorporates a cleaning step compatible with the fragile three-dimensional structures. Practicing the present invention allows controlled formation of an ultra thin dielectric upon advanced three-dimensional structures without damaging the fragile fingers or choking off of the small orifices. In addition, avoiding either a nitrogen or oxygen pile up at the silicon/silicon oxide surface or the silicon/silicon nitride interfaces helps avoid the formation of trapped charges, large capacitance-voltage (C-V) hysterysis, and increased current leakage.

While the present invention has been particularly shown and described with reference to preferred embodiments thereof, it will be understood to those skilled in the art that there is changes in form and details may be made therein without departing from the spirit and the scope of the present invention.

What is claimed is:

1. A method of making a thin oxynitride film in a semiconductor device, comprising:

cleaning the surface of said device;

heating said device to about 1050° C. for 5 to 70 seconds in the presence of $O_3$;

heating said device to a temperature of about 1100° C. in the presence of $NH_3$;

heating said device to a temperature of about 1050° C. in the presence of an oxidizing agent selected from the group of $O_2$ and $O_3$.

2. A method of claim 1 wherein said cleaning comprises heating said device to 300° C. to 400° C. in the presence of an oxidizing agent.

3. A method of claim 2 wherein said oxidizing agent comprises $O_3$.

4. A method of claim 1 wherein heating said device to about 1050° C. in the presence of $O_3$ is conducted for 5 to 48 seconds.

5. A method of claim 4 wherein heating said device to about 1050° C. in the presence of $O_3$ is conducted for 5 to 15 seconds.

6. A method of claim 5 heating said device to about 1050° C. in the presence of $O_3$ is conducted for 5 seconds.

7. A method of claim 6 wherein heating of said device in the presence of $NH_3$ is conducted for 30 to 60 seconds.

8. A method of claim 7 wherein heating of device in the presence of $O_2$ is conducted for 60 to 120 seconds.

9. A method of forming a capacitor dielectric layer over a semiconductor device having three-dimensional structures, comprising:

cleaning said device by thermal oxidation;

exposing said device to $O_3$ at a temperature of about 1050° C. for 5 to 70 seconds;

exposing said device to $NH_3$ at a temperature of about 1100° C.;

exposing said device to $O_2$ at a temperature of about 1050° C. for 30 to 60 seconds.

10. A method of claim 9 wherein cleaning said device by thermal oxidation comprises:

heating said device to 300° C. to 400° C. in the presence of an oxidizing agent.

11. A method of claim 10 wherein said oxidizing agent comprises $O_3$.

12. A method of claim 9 wherein heating said device to about 1050° C. in the presence of $O_3$ is conducted for 5 to 48 seconds.

13. A method of claim 12 wherein heating said device to about 1050° C. in the presence of $O_3$ is conducted for 5 to 15 seconds.

14. A method of claim 13 heating said device to about 1050° C. in the presence of $O_3$ is conducted for 5 seconds.

15. A method of claim 14 wherein heating of said device in the presence of $NH_3$ is conducted for 60 seconds.

16. A method of claim 15 wherein heating of device in the presence of $O_2$ is conducted for 60 seconds.

17. A continuous method of forming a thin uniform layer of oxynitride over a semiconductor device, comprising:

placing said device in a reaction chamber;

introducing $O_3$ into said reaction chamber;

heating the interior of the reaction vessel to a temperature of approximately 400° C., thereby cleaning said device;

elevating the temperature of the interior of the reaction chamber to about 1050° C. for under 48 seconds, thereby forming an initial layer of silicon oxide;

introducing $NH_3$ into the interior of the reaction vessel;

elevating the temperature of the interior of the reaction vessel to about 1100° C., thereby forming a non-uniform nitrided silicon oxide layer;

reducing the temperature of the reaction chamber to about 1050° C.;

introducing an oxidizing agent, selected from the group of $O_2$ and $O_3$ into the reaction vessel, thereby forming a silicon oxynitride layer of substantially uniform composition.

18. The method of claim 16 wherein elevation of the temperature of the interior of the reaction chamber from approximately 400° C. to approximately 1050° C. occurs at over 200° C./second.

19. The method of claim 16 wherein elevation and reduction of the temperature of the interior of the reaction chamber occurs at over 200° C./second.

* * * * *

UNITED STATES PATENT AND TRADEMARK OFFICE
CERTIFICATE OF CORRECTION

PATENT NO.   : 5,455,204
DATED        : Oct. 3, 1995
INVENTOR(S)  : Dobuzinsky et al.

It is certified that error appears in the above-indentified patent and that said Letters Patent is hereby corrected as shown below:

On the title page: Item

[75] please add the following inventor:
--Wilbur D. Pricer, Charlotte, VT.--

Column 4, line 54, delete ¡s and insert therefor --is--.

Signed and Sealed this

Thirteenth Day of February, 1996

Attest:

BRUCE LEHMAN

*Attesting Officer*           *Commissioner of Patents and Trademarks*